United States Patent [19]

Morito

[11] Patent Number: 5,159,614
[45] Date of Patent: Oct. 27, 1992

[54] PRODUCTION OF AN ADDRESS FOR EFFECTIVE USE OF A MEMORY IN A SOUND PROCESSING DEVICE

[75] Inventor: Hiroshi Morito, Tokyo, Japan
[73] Assignee: NEC Corporation, Tokyo, Japan
[21] Appl. No.: 770,231
[22] Filed: Oct. 2, 1991

[30] Foreign Application Priority Data

Oct. 4, 1990 [JP] Japan .................................. 2-266795

[51] Int. Cl.⁵ ................................................ G06F 9/26
[52] U.S. Cl. ............................................. 377/26; 377/2; 377/33; 365/236
[58] Field of Search ................ 377/2, 26, 33; 395/425; 365/236

[56] References Cited

U.S. PATENT DOCUMENTS

| | | | |
|---|---|---|---|
| 4,192,130 | 3/1980 | Takeuchi | 377/26 |
| 4,344,152 | 8/1982 | Laurer et al. | 395/425 |
| 4,485,452 | 11/1984 | Cording et al. | 377/26 |
| 4,653,077 | 3/1987 | Buschmann et al. | 377/2 |
| 4,845,726 | 7/1989 | Kurihara et al. | 377/33 |
| 4,855,681 | 8/1989 | Millham | 377/26 |

Primary Examiner—John S. Heyman
Attorney, Agent, or Firm—Laff, Whitesel, Conte & Saret

[57] ABSTRACT

For one of memory divisions that is selected at a time as a selected division N(m) in a memory for use in putting a sound processing device in operation of generating a three-dimensional image of an acoustic field, a difference signal is produced to represent a clock count minus a delay count n(m) specific to the selected division and to have more and less significant bits. For use as an address signal supplied to the memory, a part of the more significant bits is changed to a like part of a memory space address specific to the selected division. As usual, the less significant bits are used to indicate read aR(i(m)) and write W(i(m)) pointers which are spaced in the selected division by the delay count. The part may be specified to be wide and narrow when the selected division is narrow and wide. Alternatively, the part may have a predetermined bit width.

4 Claims, 4 Drawing Sheets

PRODUCTION OF AN ADDRESS FOR EFFECTIVE USE OF A MEMORY IN A SOUND PROCESSING DEVICE

BACKGROUND OF THE INVENTION

This invention relates to a memory address producing device for use in supplying an address signal to a memory which is for putting a sound processing device in operation of, typically, generating a three-dimensional image of an acoustic field in, for example, a theater.

For use in generating such a three-dimensional image, the memory is used in memorizing samples of a digital sound signal and in supplying the sound processing device in a current sampling interval with one of the samples that is sampled from the digital sound signal at a prior sampling interval which is a selected delay interval prior to the current sampling interval. The selected delay interval is selected from various delay intervals. Each delay interval is represented by a delay count representative of the number of samples sampled between the prior and the current sampling intervals.

In the manner which will later be described more in detail, a conventional memory address producing device comprises a counter for counting clock pulses to provide a clock count and to produce a count signal representative of the clock count. A group or bank of registers is used to memorize the delay counts and to produce one of the delay counts as a selected delay count in response to a control signal. Connected to the counter and coupled to the register group, a substracter subtracts the selected delay count from the clock count to provide a difference count and to produce a difference signal which represents the difference count and is used as the address signal in making the memory produce the sample sampled in the prior sampling interval.

The sound processing device comprises a plurality of basic processing units which comprise delay circuits, each for giving the selected delay to an input sound supplied thereto. In this manner, the delay circuits are used in connection with various delay counts corresponding to the various delay intervals. When the samples are sampled at a sampling frequency of 40 kHz, the selected delay count varies between a minimum count of forty and a maximum count of two hundred thousand. The memory has a memory space which is divided into a plurality of memory divisions, equal in number to the delay circuits. When used in combination with the conventional memory address producing device, each memory division must comprise memory addresses of a common number which is sufficient to cover the maximum count. The memory space is therefore used in waste. In other words, the memory space is ineffectively used.

SUMMARY OF THE INVENTION

It is therefore an object of the present invention to provide a memory address producing device which enables unexpectedly effective use of a memory for use in combination with a sound processing device.

Other objects of this invention will become clear as the description proceeds.

On describing the gist of this invention, it is possible to understand that a memory address producing device comprises: (a) a counter for counting clock pulses to provide a clock count and to produce a count signal representative of the clock count and (b) a subtracter supplied with the count signal to provide a difference count and to produce a difference signal which has a predetermined total number of bits representative of the difference count.

According to this invention, the difference signal is divided into a first part having a predetermined number of more significant bits including a most significant bit of the total number of bits and a second part having remaining bits of the total number of bits. The more significant and the remaining bits are collectively representative of the difference count. The above-understood memory address producing device comprises: (A) first supply means for supplying the subtracter with a delay count signal representative of a delay count to make the subtracter subtract the delay count from the clock count to provide the difference count; (B) a selector supplied with the first part to produce a selected signal; (C) second supply means for supplying the selector with an address space indicating signal; (D) third supply means for supplying the selector with a cyclic count signal; and (E) concatenating means for concatenating the second part to the selected signal to produce a concatenated signal representative of a memory address. The selector is for selecting first and second selected parts from the first part and from the address space indicating signal, respectively, in compliance with the cyclic count signal so that the first selected part includes the most significant bit. The selector is furthermore for changing the first selected part to the second selected part in the first part to provide a changed signal as the selected signal.

Figure 1:
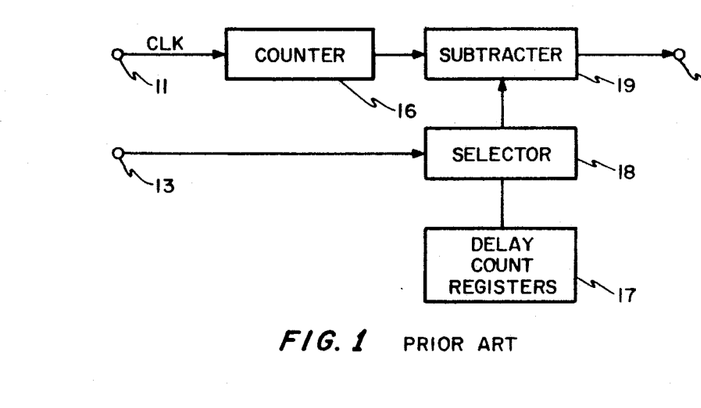
FIG. 1 is a block diagram of a conventional memory address producing device.

DESCRIPTION OF THE PREFERRED EMBODIMENTS:

Referring to FIG. 1, a conventional memory address producing device will first be described in order to facilitate an understanding of the present invention. Such a memory address producing device is for use in supplying an address signal to a memory whwch is for putting a sound precessing device in operation of generating a three-dimensional image of an acoustic field, which image is typically reverberation at a position in a room, such as in a theater.

The memory address producing device has a clock input termanal 11, a memory address output terminal 12, and a control input terminal 13. The clock input terminal 11 is supplied with a clock signal CLK comprising successive clock pulses at a clock frequency which may be selected from a clock frequency range between several hundred kHz and several MHz. The address signal output terminal 12 is for supplying the address signal to the memory which will presently be described. The control input terminal 13 is supplied with a control signal which will become clear as the description proceeds and varies from a control value to another at a varying period selected between one and four clock periods of the clock pulses.

Connected to the clock input terminal 11, a counter 16 is for counting the clock pulses from an initial count to an increased count to produce a clock count signal representative of the increased count typically by twenty-eight bits. It should be understood that the initial count is set in the counter 16 in the manner known in the art. The memory address producing device comprises a group or bank 17 of delay count registers preliminarily loaded in the known manner with delay counts which will shortly be described.

Controlled by the control signal supplied from the control input terminal 13, an input selector 18 selects one of the delay counts as a selected delay count. Connected to the counter 16 and the selector 18, a subtracter 19 is for subtracting the selected delay count from the increased count to provide a difference count and to produce a differense signal representative of the difference count. The difference signal is delivered to the memory address output terminal 12 as the address signal.

Various delay counts are therefore given to the address signal in compliance with the control signal. A delay count of zero is given to the subtracter 19 to make the address signal represent the increased count after each selected count is used in the address signal. This delay count of zero is preliminarily stored in the delay count register group 17.

Figure 2:
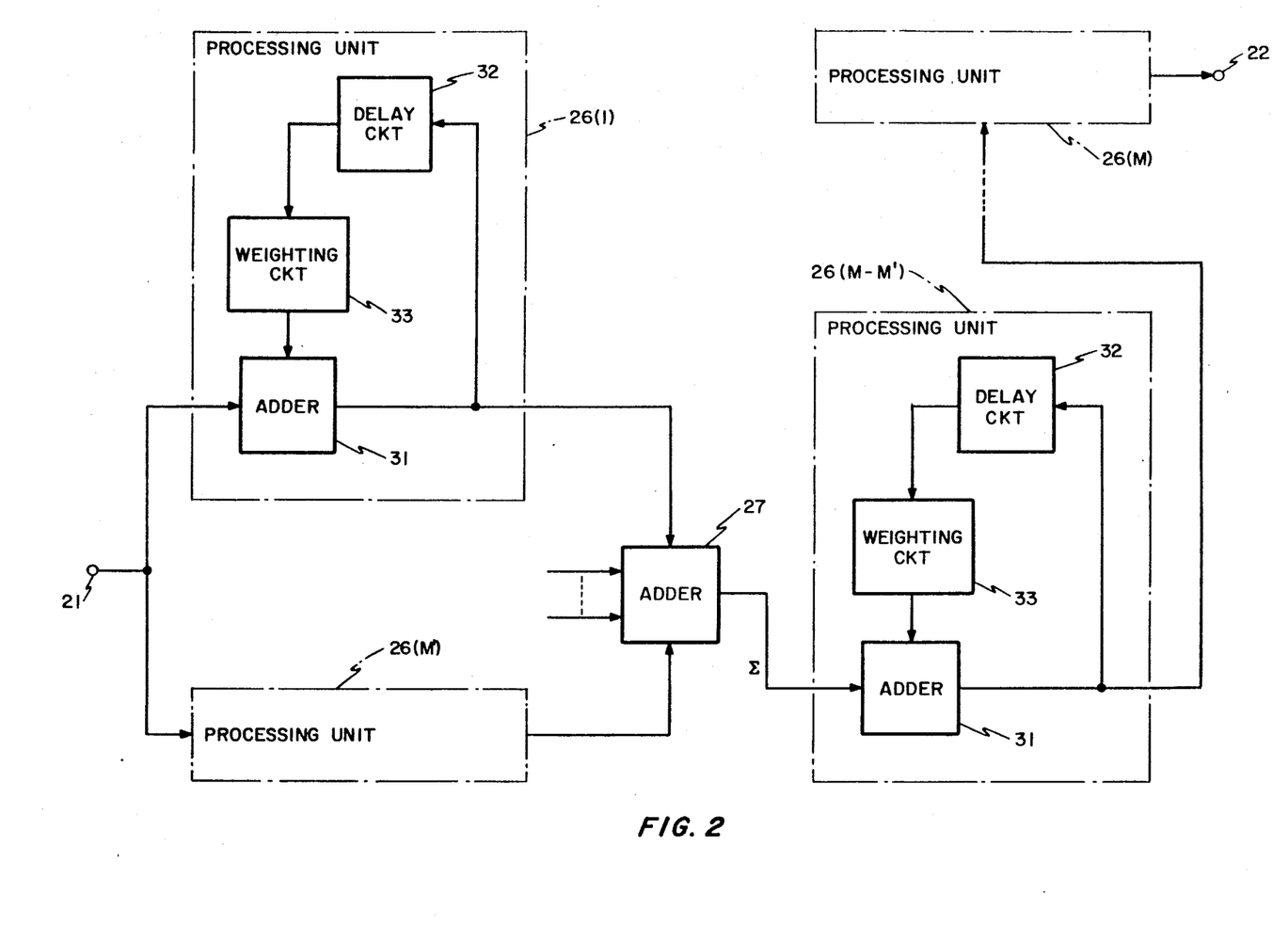
FIG. 2 is a block diagram of a sound processing device which is used in combination with a memory address producing device in general.

Referring to FIG. 2, the sound processing device will next be described. The sound processing device is known in the art and has processing device input and output terminals 21 and 22. The processing device input terminal 21 is supplied with an input sound signal representative of an input sound which is generated by a sound source (not shown) and lasts, for example, several seconds. The processing device output terminal 12 is for delivering an output sound signal to an electric-to-acoustic transducer (not shown) for producing a composite sound represented by the output sound signal.

The sound processing device comprises a selected number of basic processing units. In the example being illustrated, first through M'-th processing units 26(1) to 26(M') are connected in parallel to the processing device input terminal 21: (M—M')-th through M-th processing units 26(M—M') to 26(M) are connected in cascade between a total adder 27 and the processing device output terminal 22, where M and M' are representative of first and second selected numbers which are selected depending on the acoustic field. The whole basic processing units 26 (suffixes omitted) are M in number, among which M' basic processing units 26 and (M—M') basic processing units 26 are parallel and cascade connected processing units.

By way of example, the first selected number M is selected from a first number range between one hundred and five hundred. The second selected number M' is selected from a second number range between zero and five hundred. That is, use may be made of neither the parallel connected processing units nor the cascade connected processing units. The total adder 27 is for calculating a total sum of first through M'-th unit output signals produced by the parallel connected processing units, usually one after another to produce a summation signal $\Sigma$.

Attention will be directed to an m-th processing unit 26(m), where m is variable between 1 and M, both inclusive. The m-th processing unit comprises a partial adder 31 through which the input sound signal is delivered to a delay circuit 32 if the m-th processing unit is one of the parallel connected processing units. As an m-th delay circuit 32(m), the delay circuit 32 of the m-th processing unit gives an m-th selected delay interval n(m) to the input sound signal supplied thereto to produce an m-th delayed signal. The m-th selected delay interval is one of the various delay intervals mentioned above.

Serving as an m-th weighting circuit 33(m), a weighting circuit 33 gives an m-th weight to the m-th delayed signal to supply the partial adder 31 with an m-th weighted signal. Calcutating a sum of the input sound signal and the m-th weighted signal, the partial adder 31 delivers an m-th unit output signal to the total adder 27 and back to the delay circuit 32. In the meantime, the input sound is kept unchanged.

In the (M—M')-th processing unit 26(M—M'), the partial adder 31 is supplied with the summation signal rather than with the input sound signal. This processing unit 26(M—M') produces and (M—M')-th unit output signal, which is supplied to the partial adder 31 of a next subsequently numbered processing unit (not shown). In this manner, the M-th processing unit 26(M) delivers an M-th unit output signal to the processing device output terminal 22 as the output sound signal.

It is now understood that each basic processing unit 26 serves as a recursive filter either for the input sound signal or for one of the (M—M')-th through the (M—1)-th unit output signals that is supplied thereto. Each selected delay interval is determined by a distance between the sound source and a reflector (not shown) for an acoustic wave generated by the sound source and is in a delay range between one millisecond and about five seconds. Each weight is determined by an acoustic attenuation given to the acoustic wave which is once reflected by the reflector. The attenuation may be as great as minus 150 dB. It will be understood from the foregoing that the memory is depicted as the delay circuits 32 of the first through the M-th processing units 26.

Figure 3:
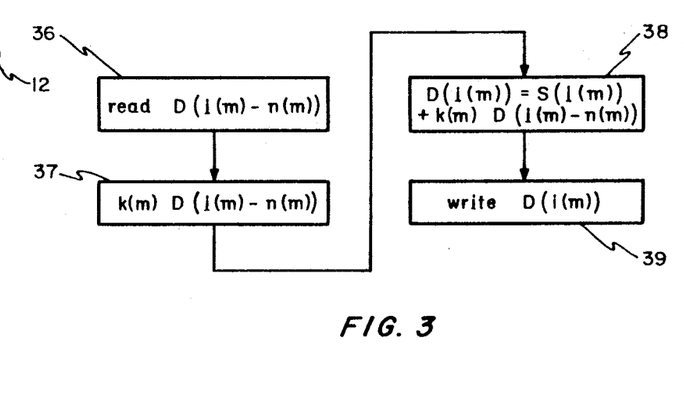
FIG. 3 is a flow chart for use in describing operation of a basic processing unit used in the sound processing device illustrated in FIG. 2.

Turning to FIG. 3, the m-th processing unit 26(m) is operable as follows. On describing the operation, attention will be directed to an i-th sampling interval or period i and to an i-th sample S(i) which is sampled from the acoustic wave in the i-th sampling interval. In general, the acoustic wave is sampled into a digital sound signal at a sampling frequency which is selected from a sampling frequency range between 30 and 50 kHz. It will be presumed throughout the following that the sampling frequency is 40 kHz.

At a first stage 36, the delay circuit 32 (FIG. 2) produces the m-th delayed signal which is now denoted by $D(i(m)-n(m))$, where $i(m)$ represents the i-th sampling interval in connection with the m-th processing unit. In other words, the m-th delayed signal is read from the memory. At a second stage 37, the m-th weighted signal is depicted by $k(m)D(i(m)-n(m))$, where $k(m)$ represents the m-th weight.

At a third stage 38, the m-th unit output signal is designated by $D(i(m))$ and is calculated according to:

$$D(i(m)) = S(i(m)) + k(m)D(i(m)-n(m)),$$

where $S(i(m))$ represents an $i(m)$-th sample which is the i-th sample $S(i)$ used in the m-th processing unit. When the m-th processing unit is one of the parallel connected processing units, the $i(m)$-th sample is the i-th sample supplied to these processing units in common. When the m-th processing unit is the (M—M')-th processing unit, the $i(m)$-th sample is the summation signal which represents the total sum of the first through the M'-th unit output signals produced by the parallel connected processing units in response to the input sound signal in the i-th sampling interval. When the m-th processing unit is one of other cascade connected processing units, the $i(m)$-th sample is the unit output signal produced by a next preceding processing unit.

At a fourth stage 39, the m-th unit output signal $D(i(m))$ is supplied back to the delay circuit 32 as a delay circuit input signal. That is, the m-th unit output signal or m-th delay circuit input signal is written in the memory.

It is now understood that the m-th selected delay interval $n(m)$ is represented in terms of samples, namely, of sampling intervals. In order to put the m-th processing unit in operation of one processing cycle, namely, of reading the m-th delayed signal from the memory and writing the m-th delay circuit input signal in the memory, the memory is twice accessed. On progressing from a processing cycle to another, the counter 16 (FIG. 1) is subjected to a step by the clock pulses. The memory address producing device makes the address signal step from that used in the i-th sampling interval to that for use in an (i+1)-th sampling interval.

Figure 4:
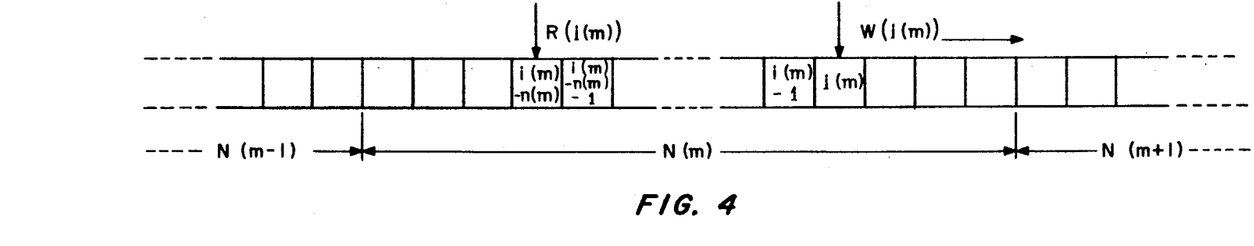
FIG. 4 schematically shows a memory space of a memory which is put in operation by a memory address producing device in general.

Further turning to FIG. 4, the memory has a memory space divided into first through M-th memory divisions or memory space divisions which are only partly depicted and indicated by $N(m-1)$, $N(m)$, and $N(m+1)$ for use by the (m−1)-th, the m-th, and the (m+1)-th processing units described in conjunction with FIG. 2. It is surmised that the memory space is given memory addresses which increase from left to right and are indicated by the address signal. Each memory address is for memorizing a memory word repsenentative of the sample. Attention will be directed in the following to the m-th memory division which consists of an m-th number of memory addresses and is contiguous to the (m−1)-th and the (m+1)-th memory divisions at m-th left and right partitions. The m-th number is represented by $N(m)$ (same reference symbol being used) and will later be described more in detail.

For the m-th memory division $N(m)$, the address signal represents in the i-th sampling interval an $i(m)$-th read address $(i(m)-n(m))$ by an $i(m)$-th read pointer $R(i(m))$ and an m-th write address $i(m)$ by a write pointer $W(i(m))$. When the address signal steps, the write and the read pointers move rightwards in the manner indicated by an arrow near the write pointer. When the write pointer reaches the right partition, the write pointer jumps back to the left partition and thence moves towards the right partition. It should be known that the read pointer likewise moves, lagging behind the write pointer by the m-th selected delay interval $n(m)$.

In view of such a cyclic movement of the write and read pointers within the m-th memory division, the m-th number $N(m)$ should be equal to two to the power of a natural number. When the conventional memory address producing device is used in accessing to the memory space, the m-th number must be equal to a number which is common to the memory divisions.

Figure 5:
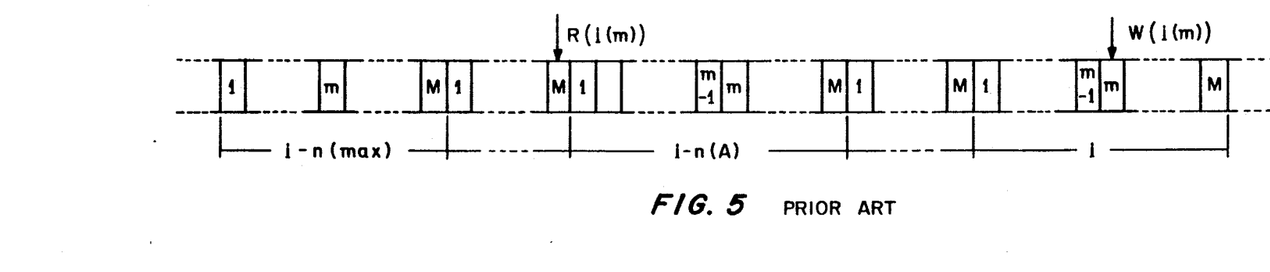
FIG. 5 schematically shows the memory space in a different manner in connection with the memory address producing device depicted in FIG. 1.

Still further turning to FIG. 5, the memory space is illustrated in a different manner. More particularly, the memory space is divided into consecutively numbered memory divisions, such as an i-th memory division, ..., an $(i-n(A))$-th memory division and so forth which are used during the i-th sampling interval i, ..., an $(i-n(A))$-th sampling interval $(i-n(A))$ and so on. A symbol $n(A)$ is used to represent the m-th selected delay interval $n(m)$ and at least one other selected delay interval that is equal to the m-th selected delay interval. In other words, the symbol $n(A)$ represents a selected delay interval.

When the conventional memory address producing device is used, each of such sampling-interval memory divisions must consist of first through M-th memory addresses which are for use by the first through the M-th processing units 26 described in connection with FIG. 2 and are indicated by 1 through M merely for simplicity of the denotation. An m-th memory address is therefore denoted by m.

It is understood from FIG. 5 that the m-th delayed signal or sample is memorized in the m-th memory address m in an $(i-n(m))$-th memory division illustrated as the $(i-n(A))$-th memory division. The selected delay interval or count $n(m)$ is variable from a minimum count $n(min)$ to a maximum count $n(max)$ depending on the various delay intervals. For the maximum count, an $(i-n(max))$ memory division is depicted.

For the conventional memory address producing device, each of such memory divisions consists of M memory addresses in the manner pointed out above. In the $(i-n(A))$-th memory division, the sample or samples may actually be memorized in only a small number of memory addresses among the M memory addresses. In the manner described heretobefore, the minimum and the maximum counts are forty and two hundred thousand when the sampling frequency is 40 kHz. It is therefore inevitable for the conventional memory address producing device that the memory should have an enormous number of memory addresses which are used in waste. In other words, the memory space is ineffectively used.

Figure 6:
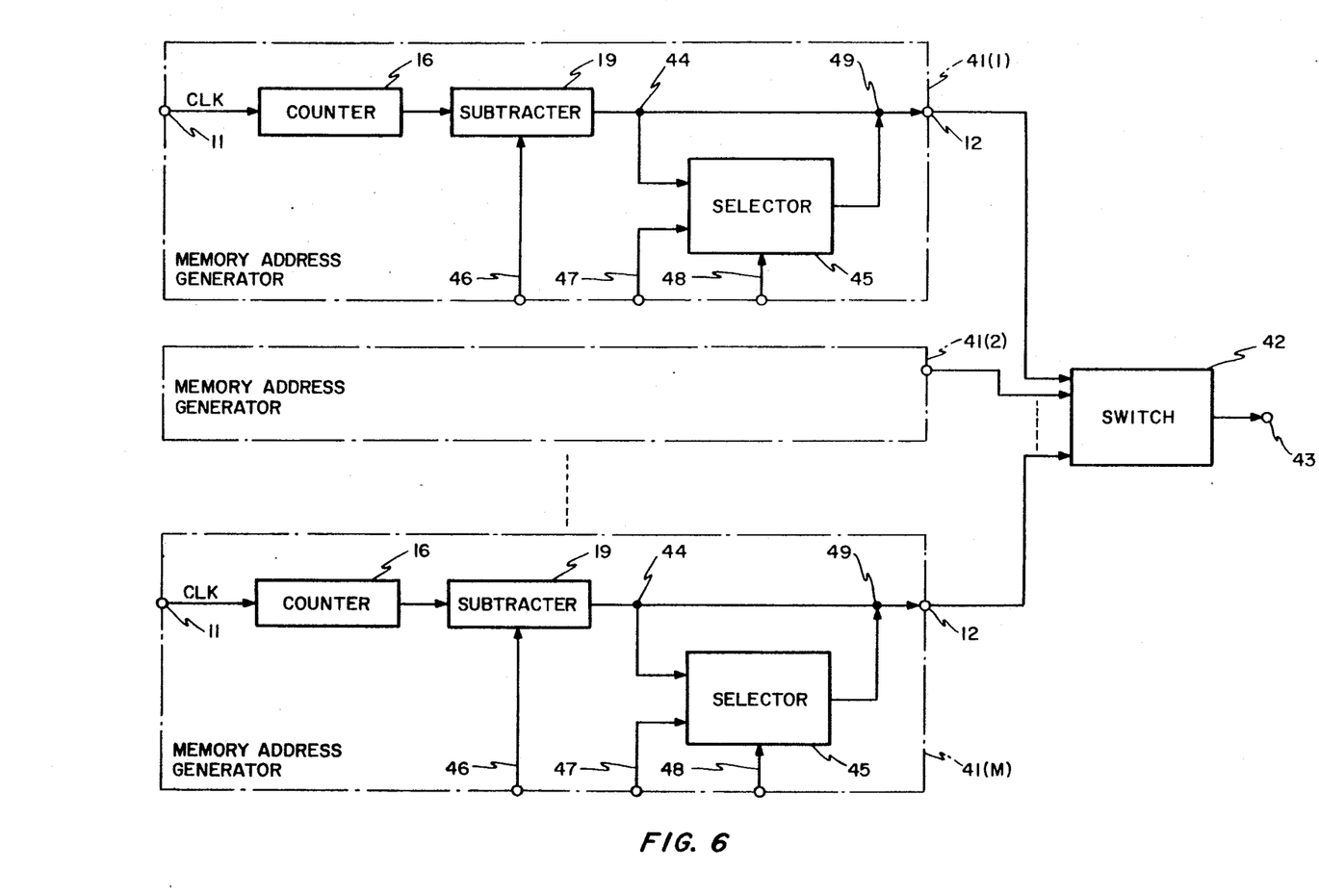
FIG. 6 is a block diagram of a memory address producing device according to a first embodiment of the instant invention.

Referring to FIG. 6, the description will proceed now to a memory address producing device according to a first embodiment of the present invention. Similar parts are designated by like reference numerals. More particularly, the clock input terminal, the address signal output terminal, the counter, and the subtracter are indicated at 11, 12, 16, and 19.

In FIG. 6, it should be noted that the memory address producing device comprises first through M-th memory address generators 41(1) to 41(M). The first through the M-th memory address generators 41 (suffixes omitted) are in one-to-one correspondence to the first through the M-th processing units 26 described in conjunction with FIG. 2.

An m-th memory address generator 41(m) has the clock input terminal 11 and the address signal output terminal 12 and comprises the counter 16 and the subtracter 19. The clock input terminals 11 of the address signal generators 41 are supplied with the clock signal CLK in common. The address signal output terminals 12 of the address signal generators 41 are connected to a switching circuit 42 which is for supplying the address signal to the memory through a producing device output terminal 43.

Like in the conventional address signal producing device, the counter 16 is for counting the clock pulses to provide a clock count and to produce a clock count signal representative of the clock count. The subtracter 19 is supplied with the count signal to provide a difference count which will presently be described. The subtracter 19 thereby produces a difference signal representative of the difference count by a predetermined total number of bits. The total number may be equal to twenty-eight when the first selected number M is equal to five hundred and furthermore when the maximum count n(max) is equal to two hundred thousand.

According to this invention, the difference signal is divided at a dividing point 44 into first and second parts. The first part has or consists of a predetermined number of more significant bits of the difference signal and includes a most significant bit of the difference signal. The second part has remaining bits or less significant bits of the difference signal. The more significant and the remaining bits are collectively representative of the difference count.

The m-th memory address generator comprises an output selector 45. From the dividing point 44, the first part of the difference signal is delivered to the selector 45.

Through a first lead 46, the subtracter 19 is supplied with a delay count signal representative of the m-th selected delay count n(m) of the type described. The subtracter 19 subtracts the delay count from the clock count to provide the difference count for the read pointer described before. In the manner described above, the delay count signal is switched to represent the delay count of zero for the write pointer after having represented the m-th delay count.

Through a second lead 47, the selector 45 is supplied with an address space indicating signal which will shortly be described. Through a third lead 48, the selector 45 is controlled by a cyclic count signal representative of a cyclic count or amount which is given by a complement of the m-th number N(m) of memory addresses in the m-th memory division N(m) of the type described in connection with FIG. 4. It should, however, be noted that the m-th number is now equal to a minimum integer which is not less than the m-th selected delay count n(m) and is equal to two to the power of a natural number.

The address space indicating signal represents a memory space address or an address space indicating datum given to each of the memory divisions illustrated with reference to FIG. 4. It should be noted in this connection that the first through the M-th numbers N(l) to N(M) may now be different from one another. The memory space address has an accordingly different number of effective bits. For example, the memory space address is represented by only six bits when the m-th number N(m) is for the selected delay count n(m) of forty. The memory space address is represented by eighteen bits when the m-th number is for the selected delay count of two hundred thousand.

In compliance with the cyclic count, the selector 45 selects a first selected part from the first part of the difference signal and a second selected part from the address space indicating signal. The first selected part should include the most significant bit of the difference signal. Similarly, the second selected part includes a most significant bit of the address space indicating signal.

The selector 45 substitutes the second selected part for the first selected part in the first part of the difference signal to provide a changed signal as the selected signal. In other words, the selector 45 changes the first part to the changed signal by changing the first selected part to the second selected part. The memory space addresses are used in this manner in the first through the M-th address signal generators 41 so as to prevent at least two of the address signals of the address signal generators 41 from indicating only one memory address in common.

A concatenating point 49 is connected to the dividing point 44 and to the selector 45. The concatenating point 49 is for bit-concatenating the second part of the difference signal to the selected signal to provide a concatenated signal with the selected signal used instead of the first part. Connected to the address signal output terminal 12, the concatenating point delivers the concatenated signal to the address signal output terminal 12 as the address signal.

It should be noted in connection with the above that the address signal represents the read and the write pointers at the memory addresses which are different from those represented by the address signal described in conjunction with FIG. 1. What is important is, however, the delay count between the read and the write pointers. The memory therefore produces the samples which are adequate for use in the sound processing device illustrated with reference to FIG. 2.

Incidentally, the cyclic count is small and great when the m-th selected delay count n(m) is great and small, respectively. Each of the first and the second selected parts therefore has a less and a greater number of bits when the m-th selected delay count n(m) is great and small, respectively.

A simplified example will be described. It will be assumed that ths predetermined total number of bits of the difference signal and consequently of the clock count signal is only eight bits and that the i(m)-th memory address is represented by a binary number (1101 0111). Let the memory space address be represented by six bits as another binary number (10 0000). When the cyclic count specifies two bits and four bits as each of the first and the second selected parts, the address signal represents binary numbers (1001 0111) and (1000 0111).

FIG. 4 will again be referred to. In the manner described before and above, the m-th number N(m) is equal to a number common to the first through the M-th memory divisions N(l) to N(M) and is variable according to the m-th selected delay count n(m) when use is made of the conventional memory address producing device and of that being illustrated. For the conventional memory address producing device, every memory division has at least two hundred thousand memory addresses. The i(m)-th and the (i(m)−n(m))-th samples may therefore be memorized in the memory addresses which are far distant from the right and the left partitions when the m-th selected delay count n(m) is small. In marked contrast, the i(m)-th and the (i(m)−n(m))-th samples are memorized for the memory address producing device being illustrated in memory addresses which are always considerably adjacent to the right and the left partitions even when the m-th selected delay count is as small as forty. It is now understood that the memory space is astonishingly effectively used with no waste when use is made of the memory address producing device being illustrated.

Reviewing now FIG. 6, it is understood that the first lead 46 serves as a first supply section for supplying the subtracter 19 with the delay count signal representative of the selected delay count, such as the m-th selected delay count n(m). The second lead 47 serves as a second supply section for supplying the selector 45 with the address space indicating signal. The third lead 48 serves as a third supply section for supplying the selector 45 with the cyclic count signal.

Figure 7:
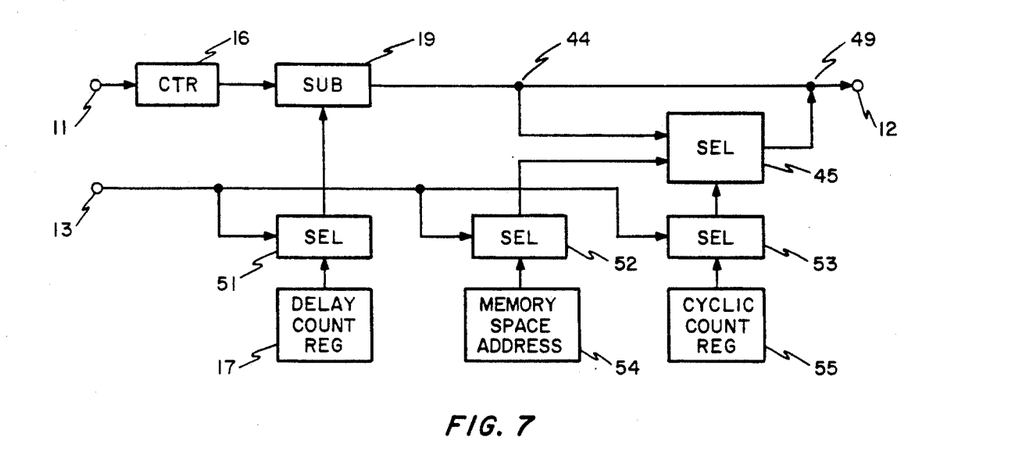
FIG. 7 is a block diagram of a memory address producing device according to a second embodiment of this invention.

Referring now to FIG. 7, attention will be directed to a memory address producing device according to a second embodiment of this invention. Similar parts are designated by like reference numerals. More specifically, the memory address producing device has the clock input terminal 11, the address signal output terminal 12, and the control input terminal 13 and comprises the counter 16, the delay count register group 17, the subtracter 19, the dividing point 44, the output selector 45, and the concatenating point 49. A first selector 51 is an equivalent of the input selector 18 described in conjunction with FIG. 1 and is designated by a different reference numeral merely for convenience of the description.

The delay count register group 17 is preliminarily loaded with the delay count of zero and with the first through the M-th selected delay counts n(1) to n(M). The memory space indicating signal and the cyclic count signal are delivered to the selector 45 through second and third selectors 52 and 53. Together with the first selector 51, the second and the third selectors 52 and 53 are controlled by the control signal supplied from the control input terminal 13.

Connected to the second selector 52, a group 54 of memory space address registers is preliminarily loaded with first through M-th memory space addresses. Connected to the third selector 53, another group 55 of cyclic count registers is for preliminarily memorizing first through M-th cyclic counts.

Being illustrated with reference to FIG. 7, the address signal producing device is for supplying the address signal to the memory in order to access to the memory addresses at which previous samples are read for supply to the first through the M-th processing units 26 described in connection with FIG. 2. The first through the M-th memory space addresses and the first through the M-th cyclic counts are used in producing the address signal for use in accessing to such memory addresses. It is now understood that the address signal is produced by the address signal producing device being illustrated like by that described with reference to FIG. 6.

It is furthermore understood that the control input terminal 13 is known in the art and serves as a control signal producing section for producing the control signal for use in switching the address signal for use in accessing to one of the memory addresses that should be used in controlling a selected one of the first through the M-th processing units 26 of the sound processing device.

A combination of the first selector 51 and the delay count register group 17 serves as a first selecting section controlled by the control signal for selecting a selected delay count from a plurality of delay counts to make the delay count signal represent the selected delay count. Another combination of the second selector 52 and the memory space address register group 54 serves as a second selecting section controlled by the control signal for selecting a selected memory space address from a plurality of memory space addresses to make the memory space indicating signal represent the selected memory space address. Still another combination of the third selector 53 and the cyclic count register group 55 serves as a third selecting section controlled by the control signal for selecting a selected cyclic count from a plurality of cyclic counts to make the cyclic count signal represent the selected cyclic count.

A combination of the control signal producing section (13) and the first selecting section (51, 17) serves as the first supply section (46) of the type described above. Another combination of the control signal producing section and the second selecting section (52, 54) serves as the second supply section (47). Still another combination of the control signal producing section and the third selecting section (53, 55) serves as the third supply section (48).

Figure 8:
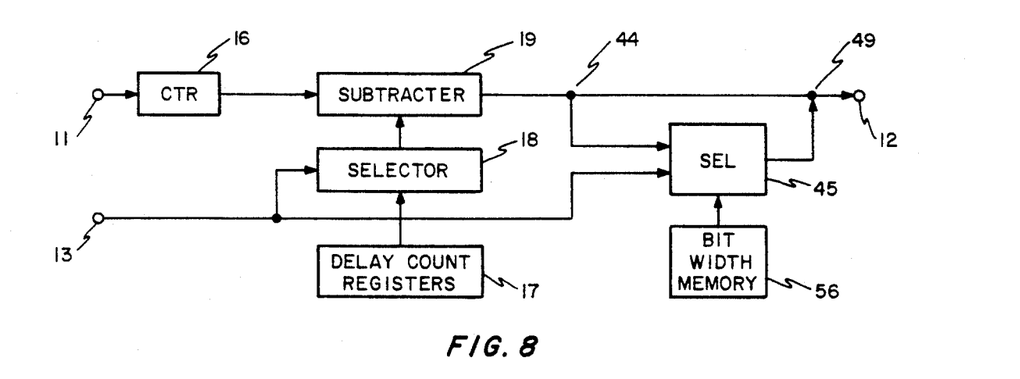
FIG. 8 is a block diagram of a memory address producing device according to a third embodiment of this invention.

Referring to FIG. 8, the description will proceed to a memory address producing device according to a third embodiment of this invention. Similar parts are designated again by like reference numerals.

More particularly, the memory address producing device has the clock input terminal 11, the address signal output terminal 12, and the control input terminal 13 and comprises the counter 16, the delay count register group 17, the input selector 18, the subtracter 19, the dividing point 44, the output selector 45, and the concatenating point 49. The input selector 18 is not different from the first selector 51 described in conjunction with FIG. 7.

Controlled by the control signal supplied from the control input terminal 13, the input selector 18 selects one of the delay count of zero and the first through the M-th selected delay counts at a time for supply to the subtracter 19 from the delay count register group 17. A combination of the input selector 18 or 51 and the delay count register group 17 therefore serves as the first selecting section (51, 17) described above.

The output selector 45 is supplied with the control signal instead of the memory space indicating signal. In other words, the control signal producing section (13) is used instead of either the second supply lead 47 described in connection with FIG. 6 or a combination of the second selector 52 and the memory space address register group 54 described in conjunction with FIG. 7. The control signal producing section (13) therefore serves in the exemple being illustrated as the second selecting section (52, 54) described above as well as the second supply section (47 or 13, 52, 54) described before. It should be understood in this connection that the control signal comprises a processing unit indicating part for indicating, as the afore-mentioned control value, one of the first through the M-th processing units 26 described in connection with FIG. 2 at a time.

A constant bit width memory 56 is connected to the output selector 45 instead of either the third lead 48 or a combination of the third selector 53 and the cyclic count register group 55. The constant bit width memory 56 is for supplying the output selector 45 with a constant bit width signal representative of a predetermined bit width which is selected from a bit width range between six and eighteen bits. The output selector 45 selects the first selected part from the first part of the difference signal and the second selected part from the processing unit indicating part of the control signal. Each of the first and the second selected parts has the predetermined bit width. The output selector 45 substitutes the second selected part for the first selected part in the first part of the difference signal to produce the changed signal of the type described before.

The processing unit indicating part may alternatively be called a memory division indicating part which indicates one of the first through the M-th memory divisions at a time for use by one of the first through the M-th processing units 26. The constant bit width memory 56 serves as a constant bit width signal producing section.

It is therefore possible in connection with the illustrated example to understand that the third supply section (48 or 17, 53, 55) comprises a constant bit width signal producing section (56) for producing the constant bit width signal as a substantial equivalent of the cyclic count signal. The constant bit width signal represents the predetermined bit width which is substantially equivalent to the cyclic count. Incidentally, the first selecting section (18 or 51, 17) may simply be referred to as a selecting section.

Figure 9:
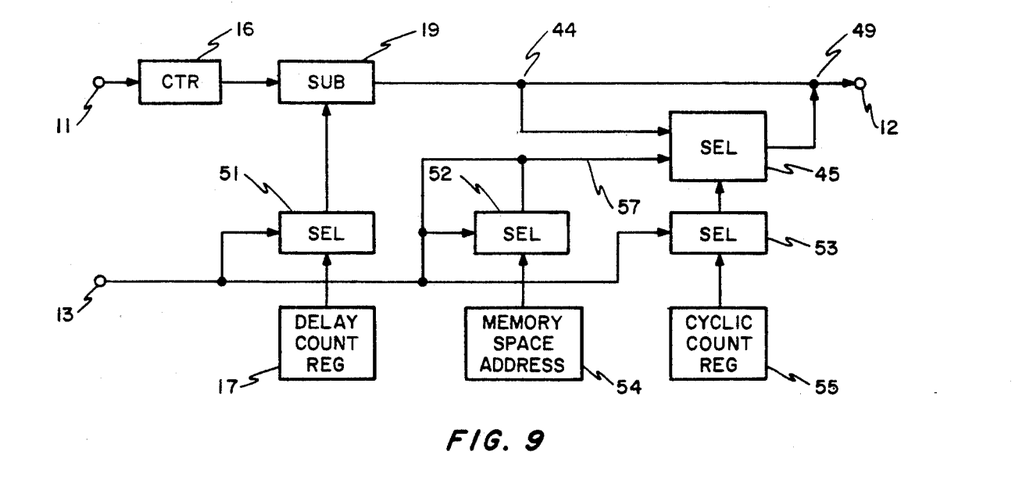
FIG. 9 is a block diagram of a memory address producing device according to a fourth embodiment of this invention.

Referring to FIG. 9, attention will finally be directed to a memory address producing device according to a fourth embodiment of this invention. Similar parts are designated again by like reference numerals.

More particularly, the memory address producing device has the clock input terminal 11, the address signal output terminal 12, the control input terminal 13 and comprises the counter 16, the delay count register group 17, the substracter 19, the dividing point 44, the output selector 45, the concatenating point 49, the first through the third selectors 51 to 53, the memory space address register group 54, and the cyclic count register group 55. These circuit elements are operable in the manner described in conjunction with FIG. 7.

In FIG. 9, the control input terminal 13 is connected to the output selector 45 through an additional connection 57 which is used as a branch from the control input terminal 13 as well as a connection between the second selector 52 and the output selector 45. The address signal producing device is therefore additionally operable in the manner described in connection with FIG. 8.

It is now understood in connection with the illustrated example that the second selecting section (52, 54) additionally comprises the control signal producing section (13) to select a selected datum at a time from a plurality of memory space addresses and the first through the M-th memory divisions when the memory division selecting part of the control signal indicates one of the memory divisions that has a relatively small and great number of memory addresses, respectively.

What is claimed is:

1. A memory address producing device comprising a counter for counting clock pulses to provide a clock count and to produce a count signal representative of said clock count and a subtracter supplied with said count signal to provide a difference count and to produce a difference signal consisting of a first part having a predetermined number of more significant bits including a most significant bit and a second part having remaining bits, said more significant and said remaining bits being collectively representative of said difference count, said memory address producing device comprising:
first supply means for supplying said subtracter with a delay count signal representative of a delay count to make said subtracter subtract said delay count from said clock count to provide said difference count;
a selector supplied with said first part to produce a selected signal;
second supply means for supplying said selector with an address space signal;
third supply means for supplying said selector with a cyclic count signal; and
concatenating means for concatenating said second part to said selected signal to produce a concatenated signal representative of a memory address;
said selector being for selecting first and second selected parts from said first part and from said address space indicating signal, respectively, in compliance with said cyclic count signal, said first selected part including said most significant bit, said selector being for changing said first selected part to said second selected part in said first part to provide a changed signal as said selected signal.

2. A memory address producing device as claimed in claim 1, further comprising control signal producing means for producing a control signal for use in switching said address signal, wherein:
said first supply means comprises first selecting means controlled by said control signal for selecting a selected delay count from a plurality of delay counts to make said delay count signal represent said selected delay count;
said second supply means comprising second selecting means controlled by said control signal for selecting a selected memory space address from a plurality of memory space addresses to make said memory space indicating signal represent said selected memory space address;
said third supply means comprising third selecting means controlled by said control signal for selecting a selected cyclic count from a plurality of cyclic counts to make said cyclic count signal represent said selected cyclic count.

3. A memory address producing device as claimed in claim 1, further comprising control signal producing means for producing a control signal comprising a memory division indicating part for indicating a selected memory division at a time among a plurality of memory divisions to make said address signal access to said selected memory division, wherein:
said first supply means comprises selecting means controlled by said memory division indicating part for selecting a selected delay count from a plurality of delay counts to make said delay count signal represent said selected delay count;
said second supply means comprising said control signal producing means to use said memory division indicating part as said memory space indicating signal;
said third supply means comprising constant bit width signal producing means for producing a constant bit width signal as the cyclic count signal representative of a predetermined bit width as said cylic count.

4. A memory address producing device as claimed in claim 1, further comprising control signal producing means for producing a control signal comprising a memory division indicating part for indicating a selected memory division at a time among a plurality of memory divisions to make said address signal access to said selected memory division, wherein:
- said first supply means comprises first selecting means controlled by said memory division indicating part for selecting a selected delay count from a plurality of delay counts to make said delay count signal represent said selected delay count;
- said second supply means comprising second selecting means for selecting a selected datum at a time from a plurality of memory space addresses and said plurality of memory divisions to make said memory space indicating signal represent said selected datum;
- said third supply means comprising third selecting means controlled by said memory division indicating part for selecting a selected cyclic count from a plurality of cyclic counts to make said cyclic count signal represent said selected cyclic count.

* * * * *